(12) United States Patent
Koo et al.

(10) Patent No.: US 9,482,724 B2
(45) Date of Patent: Nov. 1, 2016

(54) LOAD DETECTING METHOD AND POWER SUPPLY DEVICE WHERE THE METHOD IS APPLIED

(71) Applicant: FAIRCHILD KOREA SEMICONDUCTOR LTD., Bucheon-si (KR)

(72) Inventors: Gwanbon Koo, Bucheon-si (KR); Euisoo Kim, New Taipei (TW)

(73) Assignee: Fairchild Korea Semiconductor LTD. (KR)

( * ) Notice: Subject to any disclaimer, the term of this patent is extended or adjusted under 35 U.S.C. 154(b) by 56 days.

(21) Appl. No.: 14/678,504

(22) Filed: Apr. 3, 2015

(65) Prior Publication Data

US 2015/0285870 A1 Oct. 8, 2015

Related U.S. Application Data

(60) Provisional application No. 61/976,217, filed on Apr. 7, 2014.

(51) Int. Cl.

| | |
|---|---|
| *G01R 31/04* | (2006.01) |
| *H02M 3/335* | (2006.01) |
| *G01R 31/40* | (2014.01) |
| *H02M 3/156* | (2006.01) |
| *H02M 1/00* | (2006.01) |

(52) U.S. Cl.
CPC ............... *G01R 31/40* (2013.01); *G01R 31/04* (2013.01); *H02M 3/33507* (2013.01); *H02M 3/33576* (2013.01); *H02M 2001/0035* (2013.01); *Y02B 70/16* (2013.01)

(58) Field of Classification Search
CPC ............ H02M 2001/0032; H02M 2001/0035; H02M 3/156; H02M 3/335; H02M 3/33507; H02M 3/33523; H02M 3/33576; H02M 3/33592; G01R 31/04; G05F 1/452
See application file for complete search history.

(56) References Cited

U.S. PATENT DOCUMENTS

| | | | | |
|---|---|---|---|---|
| 2009/0174413 | A1* | 7/2009 | Bucella | G01R 31/041 324/511 |
| 2014/0103956 | A1* | 4/2014 | Tseng | G01R 31/40 324/764.01 |
| 2015/0015271 | A1* | 1/2015 | Hsu | H03K 19/20 324/538 |
| 2016/0146877 | A1* | 5/2016 | Kesterson | G01R 1/30 324/649 |

\* cited by examiner

*Primary Examiner* — Gary L Laxton
(74) *Attorney, Agent, or Firm* — Grossman Tucker Perreault & Pfleger PLLC

(57) ABSTRACT

A load detecting method relates to detecting connection or detachment between a power supply device and a load, and the load detecting method includes steps of determining whether a load detection operation is necessary or not, based on a detection voltage corresponding to an output voltage from the power supply device, when determining the load detection operation to be necessary, estimating a specific time point in a first period during which the output voltage of the power supply device decreases from a first level to a second level, and applying a test signal to the output voltage for a predetermined detection period with reference to the specific time point. The switching operation of a power switch of the power supply device does not occur in the first period.

11 Claims, 3 Drawing Sheets

LOAD DETECTING METHOD AND POWER SUPPLY DEVICE WHERE THE METHOD IS APPLIED

CROSS-REFERENCE TO RELATED APPLICATION

This application claims priority from U.S. Patent Provisional Application No. 61/976,217, filed on Apr. 7, 2014, in the United States Patent & Trademark Offices (USPTO), the disclosure of which is incorporated herein by reference in its entirety.

BACKGROUND

1. Field

Embodiments of the present disclosure relate to a load detecting method, and more particularly, to a method for detecting whether a load is connected to or detached from a power supply device, and a power supply device applying the same.

2. Discussion of Related Art

It is necessary to detect whether the capacitive load is connected to or detached from a power supply device. In order to detect such connection status of the capacitive load, a predetermined signal may be applied to an output voltage fed from the power supply device. The amplitude of the applied signal (hereinbelow, 'test signal') is limited, as the effective switching frequency is decreased.

The output voltage from the power supply device is so controlled that it remains within a set range between maximum and minimum voltages. Even with an application of the test signal on the output voltage, the output voltage has to remain between the maximum voltage and the minimum voltage.

Given this condition, as the load decreases causing the switching frequency to decrease, the output voltage ripple from the power supply device increases and the room to add the test signal decreases. Further, since the output voltage ripple increases even in the burst mode operation for the decreasing load, the room to add the test signal decreases.

SUMMARY

A technical objective of the present disclosure is to provide a load detecting method for detecting with accuracy whether or not a power supply device is connected to a load, and a power supply device applying the method.

In an embodiment, a method for detecting connection or detachment between a power supply device and a load is provided, which may include steps of determining whether a load detection operation is necessary, based on a detection voltage corresponding to an output voltage from the power supply device, when determining the load detection operation to be necessary, estimating a specific time point in a first period during which the output voltage of the power supply device decreases from a first level to a second level, and applying a test signal to the output voltage for a predetermined detection period with reference to the specific time point. Switching operation of a power switch of the power supply device does not occur in the first period.

Estimating the specific time point may include detecting the specific time point within current switching cycle of the power switch, and estimating a next specific time point in a first period for next switching cycle based on the detected specific time point.

When the power switch switches in a burst mode, estimating the specific time point may include detecting a specific time point of a non-switching period of current burst cycle of the power switch, and estimating a next specific time point in a first period of next burst cycle.

The load detecting method may additionally include detecting connection or detachment of the power supply device to or from the load based on a result of comparing a waveform of the test signal to a waveform detected from the output voltage to which the test signal is applied.

In an embodiment, a power supply device is provided, which may include a power switch, a power delivery device configured to convert an input into an output according to switching operation of the power switch, and a load detecting device configured to determine whether a load detection operation is necessary based on a detection voltage corresponding to the output, and when it is determined that the load detection operation is necessary, estimate a specific time point in a first period during which the output decreases from a first level to a second level, and apply a test signal to the output for a predetermined detection period with reference to the specific time point, wherein switching operation of the power switch does not occur in the first period.

The load detecting device may detect the specific time point within current switching cycle of the power switch, and estimate a next specific time point in a first period for next switching cycle based on the detected specific time point.

When the power switch switches in a burst mode, the load detecting device may detect a specific time point of a non-switching period of current burst cycle of the power switch, and estimate a next specific time point in a first period of next burst cycle based on the detected specific time point.

The load detecting device may detect connection or detachment of the power supply device to or from the load, depending on a result of comparing a waveform of the test signal to a waveform detected from the output voltage to which the test signal is applied.

The power supply device may additionally include a connection switch configured to deliver the output to a load, wherein the load detecting device turns off the connection switch when the load is detected to be detached from the output.

The specific time point may be a middle time point of the first period.

A load detecting method and a load detecting device applying the method are proposed, which are capable of accurately detecting whether or not the power supply device is connected to the load.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
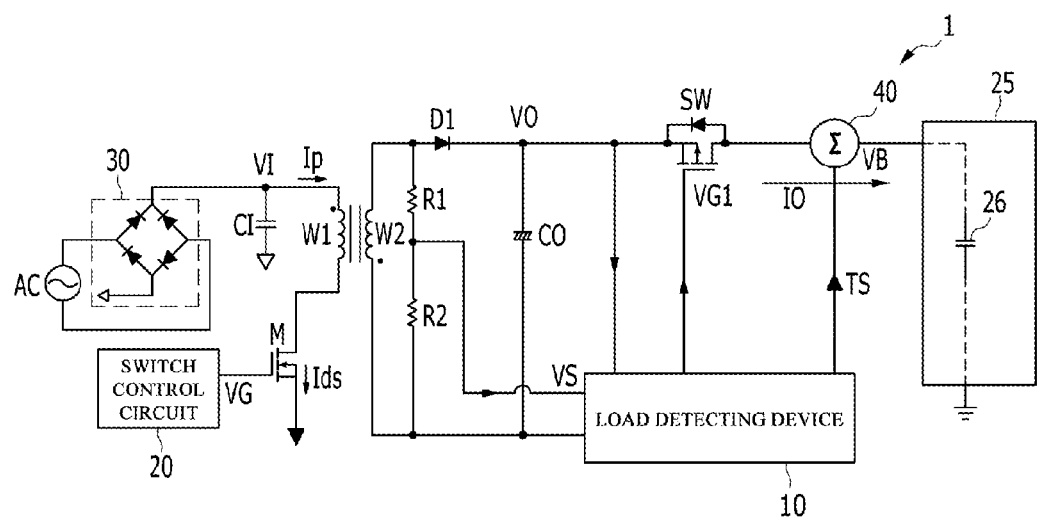
FIG. 1 illustrates a power supply device applying a load detecting method using a test signal according to an embodiment.

The present invention will be described more fully hereinafter with reference to the accompanying drawings, in which exemplary embodiments of the invention are shown. Exemplary embodiments of the present invention are described below in sufficient detail to enable those of ordinary skill in the art to embody and practice the present invention. This invention may, however, be embodied in different forms and should not be construed as limited to the embodiments set forth herein. In the descriptions of the present invention, known configurations that are not related to the gist of the present invention may be omitted. With the addition of reference numerals in components of each drawing, like numerals refer to like components throughout the specification.

Throughout the specification, it will be understood that when an element is referred to as being "connected" or "coupled" to another element, it can be "directly connected" or "coupled" to the other element or may be "electrically connected" or "electrically coupled" via intervening elements which may be present. Further, it will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

In an embodiment, a test signal may be applied to an output voltage for a predetermined detection period with reference to a specific point between switching pulses of the power supply device. In another embodiment, the test signal may be applied to the output voltage for a predetermined detection period with reference to a specific point between burst packets of the power supply device. The burst packet refers to a bundle of switching operations which occur in the burst mode operation.

A method for setting a specific time point between switching pulses and setting a specific time point between burst packets may vary depending on designing conditions. An example of the specific time point between switching pulses and setting specific time point between burst packets will be explained below as an illustrative purpose, but the present disclosure is not limited to any specific example.

According to an embodiment or another embodiment, whether the load is connected or not may be determined by detecting a test signal applied to the output voltage, i.e., based on the waveform of the detected test signal. For example, the test signal detected when the load is connected to the power supply device may increase or decrease on a more gradual slope compared to the applied test signal. That is, a signal that has the waveform varying according to connection to or detachment from the load may be set as the test signal. For example, alternating current (AC) signal increasing or decreasing at a predetermined frequency may be set as the test signal, but the present disclosure is not limited to herein.

Hereinbelow, the load detection operation refers to an operation of applying a test signal to an output voltage of the power supply device for a detection period, to detect connection to or detachment from the load.

FIG. 1 illustrates the power supply device applying a load detecting method using a test signal according to an embodiment.

The power supply device 1 includes a load detecting device 10, a capacitor CI, a primary-side winding W1, a secondary-side winding W2, a rectification diode D1, a capacitor CO, a power switch M, two detection resistors R1, R2, a switch control circuit 20, a rectification circuit 30, a summer 40 and a connection switch SW.

The load detecting device 10 refers to a circuit which is employed to implement embodiments of the load detecting method as explained below.

The power supply device 1 as illustrated in FIG. 1 is implemented as a flyback type, but the power supply device 1 may be implemented as another type of converter.

Additionally, an embodiment employs a transformer as a power delivery device that delivers input to an output according to switching operation of the power switch M. For example, a transformer including a primary-side winding W1 and a secondary-side winding W2 insulated from the primary-side may be used as a power delivery means. However, the power delivery means connected to the power switch M is not limited herein. Accordingly, an inductor may be used instead of the transformer, depending on a type of the converter employed in the power supply device 1.

The AC input is rectified through the rectification circuit 30. The rectification circuit 30 may be a full-wave rectifier such as a full-bridge diode.

One electrode of the capacitor CI is connected between the rectification circuit 30 and one end of the primary-side winding W1, and the other electrode of the capacitor CI is connected to the primary-side ground. The noise of the rectified AC input may be filtered through the capacitor CI. The voltage inputted through the capacitor CI is referred to as the input voltage VI.

The input voltage VI is delivered to one end of the primary-side winding W1, and the drain of the power switch M is connected to the other end of the primary-side winding W1. The source of the power switch M is connected to the primary-side ground.

Gate voltage VG is inputted to the gate of the power switch M. The power switch M controls the power delivered from the primary-side to the secondary-side. The primary-side and the secondary-side are insulated from each other. The power switch M as illustrated in FIG. 1 is an n-channel transistor, in which the gate voltage VG to turn on the power switch M is of a high level, while the gate voltage VG to turn off the power switch M is of a low level.

The secondary-side winding W2 is electromagnetically coupled to the primary-side winding W1. Between both ends of the secondary-side winding W, two resistors R1, R2 are connected in series, and an anode of the rectification diode D1 is connected to one end of the secondary-side winding W, while a cathode of the rectification diode D1 is connected to one electrode of the capacitor CO and the source of the connection switch SW.

Voltage from the secondary-side winding W2 is divided by the two resistors R1, R2, according to which a detection voltage VS is generated, and the detection voltage VS may be used to detect no-load condition.

Upon turn-on of the power switch M, the primary-side current Ip increases, and the current Ids flows through the power switch M. For a period that the primary-side current Ip increases, energy is stored at a core by the flux induced by the primary-side winding W1. For this period, the rectification diode D1 is in non-conducting state. When the power switch M turns off and the rectification diode D1 is in conducting state, the stored energy of the core is delivered to the secondary-side winding W2 and the current flows through the rectification diode D1. For the off-period of the power switch M, the primary-side current Ip decreases and the current Ids does not flow.

The connection switch SW delivers the output power from the power supply device 1 to outside. For example, when a load 25 is connected to the drain of the connection switch SW, current is fed from the power supply device 1 via the connection switch SW and the output voltage VO is fed to the load 25. A gate voltage VG1 to control switching operation is inputted to the gate of the connection switch SW. In the embodiment illustrated in FIG. 1, the load detecting device 10 generates the gate voltage VG1 and supplies the same, although embodiments are not limited thereto.

The output current IO fed through the connection switch SW to the load 25 may be determined based on a period for which the current flows the rectification diode D1, and the current. The connection switch SW is in ON state for a period that the load 25 is connected to the power supply device 1. Referring to FIG. 1, the connection switch SW is a p-channel transistor, in which the gate voltage VG1 to turn on the connection switch SW is of a low level, and the gate voltage VG1 to turn off the connection switch SW is of a high level.

The load 25 may include an inner capacitor 26, and may be a portable device, for example.

The switch control circuit 20 may control switching frequency or on-duty of the power switch M, according to the output voltage VO. The switch control circuit 20 may acquire information about the output voltage VO in a variety of manners. For example, an auxiliary winding (not illustrated) on the primary-side, which is electromagnetically coupled to the secondary-side winding W2, may be utilized. The switch control circuit 20 may acquire information about the output voltage VO, using voltage on both ends of the auxiliary winding during OFF period of the power switch M. Alternatively, current flowing through a photo transistor that forms opto-coupler with a photo diode (not illustrated) connected to the output voltage VO, may be utilized.

The load detecting device 10 determines whether or not load detecting operation is necessary and when determining it necessary, applies a test signal TS to the output voltage VO for a detection period. FIG. 1 illustrates that the test signal TS is fed to the summer 40 connected to the drain of the connection switch SW, but embodiments are not limited herein. The summer 40 may be located at every node that can apply the test signal TS to the output voltage VO, and the load detecting device 10 may feed the test signal TS to the summer 40.

The summer 40 may sum up the output voltage VO and the test signal TS and feed the result to the load 25.

The load detecting device 10 may detect a bus voltage VB fed to the load 25 from the summer 40, and determine whether or not the load 25 is connected, based on the detected bus voltage VB. The load detecting device 10 detects waveform of the bus voltage VB to detect whether the load 25 is connected to or detached from the power supply device 1, depending on the degree of distortion of the detected signal from the applied test signal TS.

Further, the load detecting device 10 may utilize the detection voltage VS to determine whether or not the load detection operation is necessary. The frequency of the detection voltage VS varies depending on switching frequency of the power switch M. In a light loading or near a no-loading condition, the switching frequency of the power switch M may be lowered or the power switch M may operate in a burst mode. Accordingly, the frequency of the detection voltage VS may also be lowered or the detection voltage VS may be generated in waveforms corresponding to the burst mode. Accordingly, the load detecting device 10 may detect the frequency of the detection voltage VS or detect the waveform thereof, to determine whether or not the load detection operation is necessary.

When the load detecting device 10 detects detachment of the load from the power supply device 1, the load detecting device 10 may generate a gate voltage VG1 to turn off the connection switch SW. The load detecting device 10 may utilize the output voltage VO to generate voltage necessary for operation.

Figure 2:
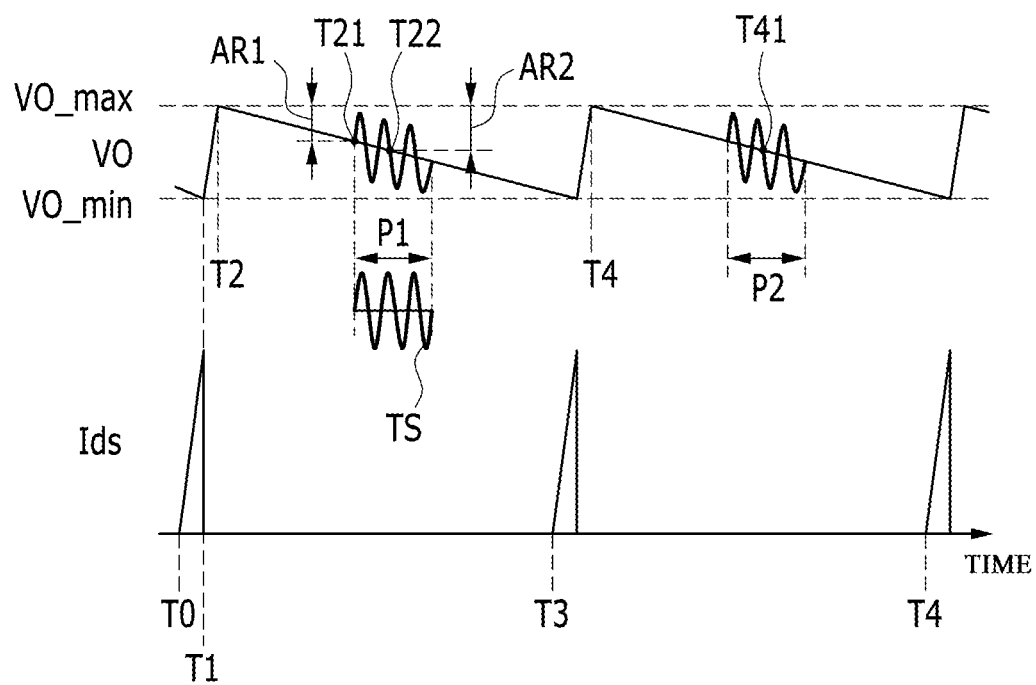
FIG. 2 shows a waveform of an output voltage applied with a test signal according to an embodiment, along with a waveform of current flowing through a power switch.

FIG. 2 shows a waveform of the output voltage added with the test signal according to an embodiment, and a waveform of the current flowing through the power switch.

The waveforms illustrated in FIG. 2 are the waveforms observed when the switching frequency of the power switch explained above is low.

The power switch M turns on at a time point T0 so that the current Ids increases, and the power switch M turns off at a time point T1 so that the current Ids rapidly decreases. Accordingly, the output voltage VO increases for a period between the time point T1 and the time point T2. The output voltage VO decreases after the time point T2, and the power switch M turns on again at a time point T3.

The time points T2, T3 may be determined by the switch control circuit 20. For example, the switch control circuit 20 controls the output voltage VO to be within a range between the maximum voltage (VO_max) and the minimum voltage (VO_min), as illustrated in FIG. 2.

Because the detection voltage VS corresponds to the output voltage VO, the load detecting device 10 may control the location of the detection period, using the detection voltage VS.

For example, the load detecting device 10 detects from a time point (e.g., T2) at which the detection voltage VS starts decreasing to a time point (e.g., T3) at which the detection voltage VS starts increasing, and detects a specific time point between the two detected time points T2 and T3. Referring to FIG. 2, a middle time point T22 between the two detected time points (T2-T3) is detected as the specific time point, but embodiments are not limited herein. Accordingly, the specific time point is not limited to the middle point.

The load detecting device 10 estimates a specific time point for the next switching period based on the specific time point determined in the current switching period. For example, the load detecting device 10 estimates a time point T41 to be the specific time point, which is the time point elapsed from the time point T4 at which the detection voltage VS starts decreasing, by a period (T2-T22). The load detecting device 10 may apply the test signal TS on the output voltage VO for the detection period P2 with reference to the specific time point T41.

The load detecting device 10 also estimates a specific time point of the current switching period (T0-T3) based on the estimated specific time point of the previous switching period. Based on assumption that the variation in the output voltage VO waveform is negligible between adjacent switching periods, FIG. 2 illustrates that the actual specific time point T22 is identical to the estimated specific time point for the sake of convenient explanation. The load detecting device 10 applies the test signal TS to the output voltage VO for a detection period P1 with reference to the specific time point T22.

The detection periods P1 and P2 may be set differently depending on switching periods, or they P1 and P2 may be set identically. The detection periods may be appropriately controlled to enhance accuracy in load detection.

In an embodiment, the test signal TS may have such an amplitude that is increased compared to the related art. For example, the amplitude of the test signal TS may be determined based on a difference AR1 of the output voltage VO and the maximum voltage VO_max of a time point T21 at which the detection period P1 begins. When the test signal TS generated in the detection period P1 is one cycle, the amplitude of the test signal TS may be determined based on a difference AR2 between the output voltage VO and the maximum voltage VO_max at the time point T22. Accordingly, in an embodiment, the room to add the test signal TS to the output voltage VO is larger than the related art.

The manners to estimate a specific time point is not limited to an example explained with reference to FIG. 2. For example, the specific time point may be estimated to be the middle time point within switching cycle (e.g., T0-T3) of the power switch M, a middle time point between maximum peaks of the output voltage VO, or a middle time point between minimum peaks of the output voltage VO. The differences between specific time points according to respective manners are negligible.

Figure 3:
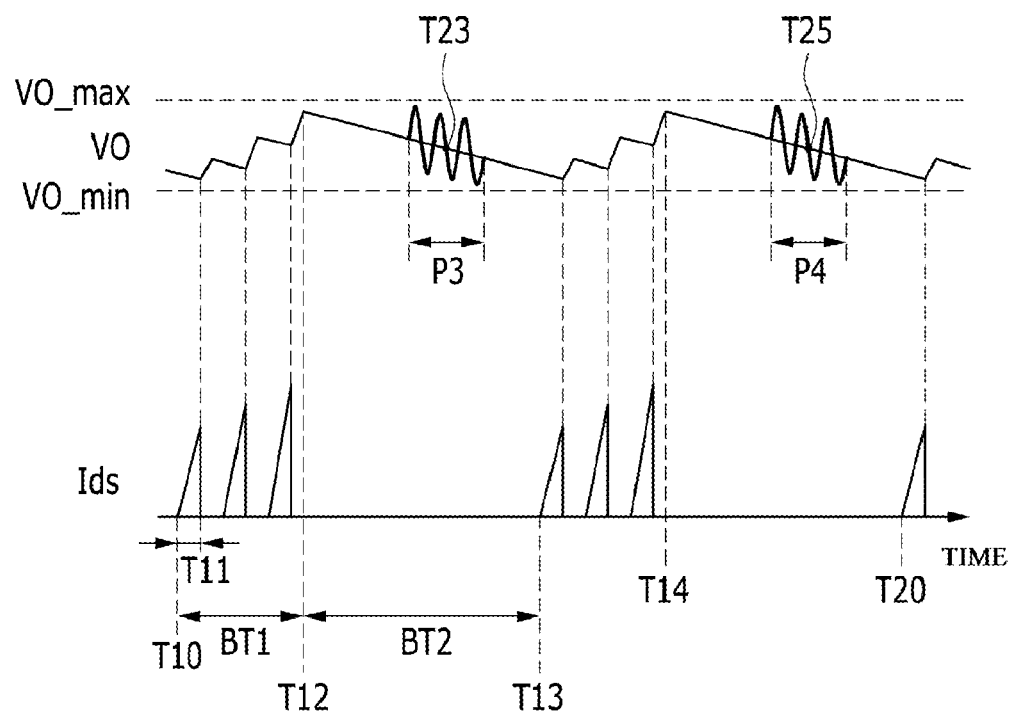
FIG. 3 shows a waveform of an output voltage applied with a test signal according to another embodiment, along with a waveform of current flowing through a power switch.

FIG. 3 shows a waveform of an output voltage added with a test signal according to another embodiment, along with a waveform of current flowing through a power switch.

The waveforms illustrated in FIG. 3 represent the waveform observed when the power switch performs switching operation in the burst mode as explained above.

As illustrated in FIG. 3, the burst packet includes a switching period BT1 during which switching operation occurs, and a non-switching period BT2 during which switching operation does not occur. In another embodiment, it is possible to detect the non-switching period BT2 to set the detection period P3 based on a specific time point within the period BT2. Hereinbelow, it is assumed that the specific time point is a middle time point of the non-switching period.

For example, the switching operation occurs during period BT1, current Ids increases during ON period (e.g., T11) of the power switch M, and the output voltage VO increases after turn-off of the power switch M. After the power switch M turns off, the output voltage VO decreases when the current does not flow through the rectification diode D1. As the above-mentioned operation repeats for period BT1, the output voltage VO increases.

The non-switching period BT2 begins at a time point T12 at which the increasing output voltage VO arrives at a predetermined threshold value, and the output voltage VO decreases. The switching operation occurs again at a time point T13 at which the decreasing output voltage VO arrives at a predetermined threshold value.

The load detecting device 10 may detect a specific time point T23 of the period T12-T13, and estimate a specific time point of the next burst cycle (e.g., T13-T20). For example, a time point T25, which is elapsed from time point T14 (at which the non-switching period of the next burst cycle begins) by the period T12-T23, may be estimated to be a specific time point. The load detecting device 10 applies the test signal TS to the output voltage VO for the detection period P4 with reference to the time point T25.

The load detecting device 10 determines a specific time point of the current burst cycle T10-T13 according to the estimated specific time point of the previous burst cycle. It is assumed that the variations in the output voltage VO waveform between adjacent burst cycles is small enough to be negligible, and FIG. 3 illustrates that the actual specific time point T23 is identical to the estimated specific time point for the sake of convenience explanation. The load detecting device 10 applies the test signal TS to the output voltage VO for the detection period P3 with reference to the specific time point T23.

The detection period P3 and the detection period P4 may be set differently depending on burst periods, or they P3 and P4 may be set identically. The detection periods may be appropriately controlled to enhance accuracy in load detection.

As explained in the previous embodiments, the test signal TS may have such amplitude that is increased compared to the related art.

The manners to estimate the specific time point is not limited to the example explained with reference to FIG. 3. For example, the specific time point may be a middle time point between maximum peak and minimum peak of the output voltage VO. The differences in the middle time points depending on respective manners are negligible.

As explained above, according to embodiments, the room to apply a test signal to the output voltage is larger than the related art. To be specific, the amplitude, which is the difference between the maximum value and minimum value of the test signal, may be close to the difference between maximum voltage and minimum voltage.

Although the exemplary embodiments of the present invention are described above in detail, the spirit or scope of the invention is not limited thereto. All various modifications by those of ordinary skill in the art using the spirit or scope of the invention of the appended claims and equivalents may belong to the scope of the right of the present invention.

DESCRIPTION OF SYMBOLS

1: power supply device
10: load detecting device
20: switch control device
30: rectification circuit

What is claimed is:

1. A method for detecting connection or detachment between a power supply device and a load, the method comprising steps of:
    determining whether a load detection operation is necessary based on a detection voltage corresponding to an output voltage from the power supply device;
    when determining the load detection operation to be necessary, estimating a specific time point in a first period during which the output voltage of the power supply device decreases from a first level to a second level; and
    applying a test signal to the output voltage for a predetermined detection period with reference to the specific time point, wherein switching operation of a power switch of the power supply device does not occur in the first period.

2. The method of claim 1, wherein estimating the specific time point comprises:
    detecting the specific time point within current switching cycle of the power switch; and
    estimating a next specific time point in a first period for next switching cycle based on the detected specific time point.

3. The method of claim 1, wherein when the power switch switches in a burst mode, estimating the specific time point comprises:

detecting a specific time point of a non-switching period of current burst cycle of the power switch; and estimating a next specific time point in a first period of next burst cycle based on the detected specific time point.

4. The method of claim 1, further comprising:

detecting connection or detachment of the power supply device to or from the load based on a result of comparing a waveform of the test signal to a waveform detected from the output voltage to which the test signal is applied.

5. The method of claim 1, wherein the specific time point is a middle time point of the first period.

6. A power supply device, comprising:

a power switch;

a power delivery device configured to convert an input into an output according to switching operation of the power switch; and a load detecting device configured to determine whether a load detection operation is necessary based on a detection voltage corresponding to the output, and when it is determined that the load detection operation is necessary, estimate a specific time point in a first period during which the output decreases from a first level to a second level, and apply a test signal to the output for a predetermined detection period with reference to the specific time point, wherein switching operation of the power switch does not occur in the first period.

7. The power supply device of claim 6, wherein the load detecting device is configured to detect the specific time point within current switching cycle of the power switch, and estimate a next specific time point in a first period for next switching cycle based on the detected specific time point.

8. The power supply device of claim 6, wherein, when the power switch switches in a burst mode, the load detecting device is configured to detect the specific time point of a non-switching period of current burst cycle of the power switch, and estimate a next specific time point in a first period of next burst cycle based on the detected specific time point.

9. The power supply device of claim 6, wherein the load detecting device is configured to detect connection or detachment of the power supply device to or from the load, depending on a result of comparing a waveform of the test signal to a waveform detected from the output voltage to which the test signal is applied.

10. The power supply device of claim 6, further comprising a connection switch configured to deliver the output to a load, wherein the load detecting device is configured to turn off the connection switch when the load is detected to be detached from the output.

11. The power supply device of claim 6, wherein the specific time point is a middle time point of the first period.

* * * * *